United States Patent [19]
Matsubara et al.

[11] Patent Number: 5,827,798
[45] Date of Patent: Oct. 27, 1998

[54] METHOD FOR PRODUCTION OF SUPERCONDUCTING POLYCRYSTALLINE WIRE ROD

[75] Inventors: Ichiro Matsubara, Minoo; Ryoji Funahashi, Kobe; Kazuo Ueno; Hiroshi Ishikawa, both of Ikeda, all of Japan

[73] Assignees: Agency of Industrial Science and Technology; Ministry of International Trade & Industry, both of Tokyo, Japan

[21] Appl. No.: 873,084

[22] Filed: Jun. 11, 1997

[30] Foreign Application Priority Data

Jun. 14, 1996 [JP] Japan .................................. 8-175828

[51] Int. Cl.$^6$ ........................................ H01L 39/24
[52] U.S. Cl. .................... 505/430; 505/230; 505/729; 505/740; 505/704
[58] Field of Search .................... 505/430, 230, 505/729, 740, 704; 117/87; 174/125.1

[56] References Cited

U.S. PATENT DOCUMENTS 5,242,896 9/1993 Matsubara et al. .
5,354,921 10/1994 Matsubara et al. .
5,550,103 8/1996 Motowidlo ............................ 505/430

OTHER PUBLICATIONS

Ichiro Matsubara, et al. "Growth of Li–Doped and Dopant-–Free Bi–Sr–Ca–Cu–O Superconducting Whiskers" Physica C 167 (1990), pp.503–508.

Ichiro Matsubara, et al. "Growth of Bi–Sr–Ca–Cu–O Based Superconducting Whiskers" Journal of Crystal Growth 110(1991), pp. 973–984.

Ichiro Matsubara, et al. "Growth Mechanism of $Bi_2 Sr_2 CaCu_2O_x$ uperconducting Whiskers"Journal of Crystal Growth 141(1994), pp. 131–140.

Ichiro Matsubara, et al. "Preparation of Fibrous Bi(Pb)–Sr––Ca–Cu–O Crystals and Their Superconducting Properties in a Bending State" Japanese Journal of Applied Physics vol. 28, No. 7, Jul. (1989), pp. L 1121–L 1124.

*Primary Examiner*—Roy V. King
*Attorney, Agent, or Firm*—Oblon, Spivak, McClelland, Maier & Neustadt, P.C.

[57] ABSTRACT

A method for the production of a superconducting polycrystalline wire rod having all the crystal (a, b, c) axes thereof aligned is disclosed, which consists of a step of arraying a plurality of superconducting whiskers of a composition of $Bi_2Sr_2CaCu_2O_8$ (Bi-2212 phase) in such a manner as to parallellize the fiber axes of the whiskers and then aligning all the crystal axes of the superconducting whiskers with parallellized fiber axes and a step of heat-treating the resultant whiskers.

4 Claims, 2 Drawing Sheets

BOTTOM ← → TOP

1
METHOD FOR PRODUCTION OF SUPERCONDUCTING POLYCRYSTALLINE WIRE ROD

BACKGROUND OF THE INVENTION

1. Field of the Invention

This invention relates to a method for the production of a superconducting polycrystalline wire rod, particularly the production of a bismuth type superconducting polycrystalline wire rod.

2. Description of the Prior Art

A superconducting substance which has a critical temperature (Tc) exceeding the temperature of liquid nitrogen is highly significant from the practical viewpoint since it enables a reduction in the cost of cooling. As concrete examples of oxide superconductors having critical temperatures exceeding the temperature of liquid nitrogen, superconducting substances of the Y system, the Bi system, and the Tl system can be cited. Of these superconducting substances, those of the Bi system include three different kinds of crystalline phases, i.e. $Bi_2Sr_2CuO_6$ phase (2201 phase), $Bi_2Sr_2CaCu_2O_8$ phase (2212 phase), and $Bi_2Sr_2Ca_2Cu_3O_{10}$ phase (2223 phase), which are otherwise called respectively 20K phase, 80K phase, and 110K phase after their critical temperatures. Among these crystalline phases, the 2212 phase is thought to be the most promising material for practical use in superconducting wire rods and materials for shielding against magnetic field because it is synthesized relatively easily, is little affected by the problem of weak link at the grain boundary as compared with the Y system superconducting substances, and has low toxicity as compared with the Tl system superconducting substances.

The silver sheath method, the doctor blade method, etc. are known as methods for the manufacture of a superconducting wire rod formed of this Bi 2212 phase, and the partial melting method, the solid phase reaction method, etc. are known as methods for the heat treatment thereof. The superconducting wire rods which are obtained by these methods are deficient in critical current density because they have a polycrystalline texture and because the crystal grains are randomly oriented particularly in the $CuO_2$ plane (ab plane) of the crystal structure. It has been recently reported that the critical current of a superconducting thin film of the 2212 phase is improved more than 10 times the normal magnitude thereof by perfectly aligning all the crystal axes, i.e. the a, b, and c axes, thereof [Phys. Re. B., Vol. 51, 6792 (1995)].

At present, superconducting wire rod of the Bi 2212 phase is manufactured by the silver sheath method, the doctor blade method, etc. A method which aligns all the crystal axes in the crystal grains forming this wire rod has never been known to the art.

The production of a high-quality wire rod of the Bi system superconducting substance requires a technique which aligns the directions of orientation of the crystal grains forming the wire rod.

The present inventors, after pursuing a study with a view to establishing such a technique, have perfected this invention.

SUMMARY OF THE INVENTION

Specifically, this invention relates to a method for the production of a superconducting polycrystalline wire rod having all the crystal (a, b, c) axes thereof aligned, which method consists essentially of a step of arraying a plurality of superconducting whiskers of a composition of $Bi_2Sr_2CaCu_2O_8$ (Bi-2212 phase) in such a manner as to parallellize the fiber axes of the whiskers and then aligning all the crystal axes of the superconducting whiskers with parallellized fiber axes and a step of heat-treating the resultant whiskers.

In this method of the invention, the step of arraying a plurality of superconducting whiskers of a composition of $Bi_2Sr_2CaCu_2O_8$ (Bi-2212 phase) in such a manner as to parallellize the fiber axes of the whiskers and then aligning all the crystal axes of the superconducting whiskers with parallellized fiber axes can be easily implemented by suspending the whiskers in an organic solvent, then placing the organic solvent suspending the whiskers therein in a container which is a glass tube or a silver tube of a diameter smaller than the length of the whiskers, subsequently removing the organic solvent therefrom and consequently obtaining a preform consisting of the superconducting whiskers whose fiber axes are oriented in one direction, and press forming the preform.

DESCRIPTION OF THE PREFERRED EMBODIMENTS

The Bi type 2212 phase superconducting whiskers used in this invention (hereinafter referred to briefly as "2212 phase whiskers" or occasionally as "whiskers") can be produced by the method disclosed in the following reference: Matsubara et al., Physics C. 167, 503 (1990).

Figure 1:
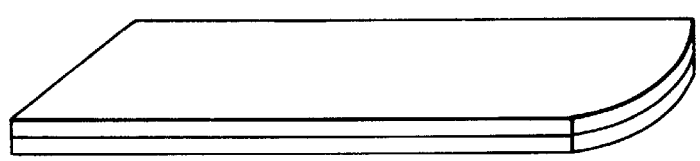
FIG. 1 is a model diagram illustrating the orientation of crystal axes of Bi-2212 phase whiskers used in this invention.
Figure 1:
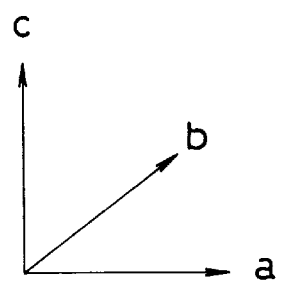

The 2212 phase whiskers used in this invention have a structure which results from the superimposition of several ribbonlike single crystals. They measure approximately 3–20 $\mu$m in thickness, 30–300 $\mu$m in width, and 3–8 mm in length. The crystal axes of the whiskers are oriented as illustrated by the model in FIG. 1. The well-grown plane in the shape of a ribbon correspond the ab plane and the c axis is perpendicular to this plane. Further, the direction of the fiber axes of the whiskers, namely, the longitudinal direction, corresponds to the a axis. Since the superconducting current is thought to flow along the ab face, its orientation is optimum for current flow in the direction of the fiber axes. By arraying the fiber axes of the 2212 phase whiskers parallelly to one another, therefore, the crystal axes of the crystal grains can be aligned.

In this invention, by thoroughly suspending whiskers in an organic solvent and then allowing the whiskers to settle in a glass tube or a silver tube having a diameter considerably smaller than the length of the whiskers, a preform in which the fiber axes or a axes of the whiskers are aligned can be fabricated. The organic solvent used in this procedure is not particularly restricted except for the requirement that it be incapable of reacting with the superconducting whiskers. Hexane may be cited as one concrete example. After the sedimentation is completed, the organic solvent is thoroughly vaporized. The preform, when produced by the use of a glass tube, is extracted from the glass tube, interposed between two silver sheets, and pressed under a pressure in the range of 50–100 MPa. When the preform is produced by the use of a silver tube, the organic solvent is thoroughly vaporized and the preform is similarly pressed.

At the preform stage, only the a axes of the whiskers are in an aligned state. When the preform is pressed, the well-grown plane of the whiskers are parallellized to one another and, as a result, the c axes and the b axes are also aligned, because the whiskers have the shape of a ribbon. This invention is characterized by manufacturing a shaped article of whiskers having all the crystal axes thereof aligned, by a process of the two steps of arraying the whiskers in such a manner as to parallellize the fiber axes of the whiskers and then pressing the arrayed whiskers as described above. The conventional technique manufactures a wire rod from 2212 phase powder crystals and, therefore, is unable to mutually align the crystal axes, particularly the a axes or the b axes, of the powder crystals. In contrast, this invention uses whiskers which have an elongate shape exclusively in the direction of their a axes and, therefore, enables all the crystal axes to be aligned.

Then, the shaped article is heat-treated (fired). The means for this heat treatment is not particularly limited but is only required to be capable of accomplishing an arbitrary firing schedule. Any of such well-known means as the electric furnace, the gas furnace, and the photothermal furnace can be adopted. The temperature and the time of the heat-treatment are generally in the approximate ranges of 830°–860° C. and 40–140 hours, respectively. For example, the heat-treatment is performed at 840° C. for 120 hours.

If the heat-treatment is performed insufficiently, the produced wire rod will fail to acquire the quality aimed at. If it is performed excessively, the 2212 phase will be decomposed and the produced wire rod will manifest no superconductivity.

The wire rod obtained by the method of this invention, by a test for resistivity and for temperature dependency of magnetic susceptibility, was confirmed to assume superconductivity at 70–75K. For the purpose of rating the whiskers forming the fired wire rod for the property of orientation, the whiskers were observed under an electron microscope to determine the distribution of the angles formed by the fiber axes or the a axes of the whiskers (distribution of deviation). The fiber axes having deviation angles of 15 degrees or less were found to account for 95% of all the fiber axes, indicating that the fiber axes were satisfactorily aligned.

The improvement of the Bi type superconducting wire rod in critical current density attained in this invention by the alignment of the crystal axes is believed to be caused as follows.

Studies on the thin film of the Bi type 2212 phase show that the alignment of all the crystal axes of crystal grains mitigates the effect of weak superconducting link at the crystal grain boundary and, as a result, improves the critical current density. It is considered that in the wire rod manufactured by this invention by the use of superconducting whiskers, the alignment of the crystal axes overcomes the problem of weak link at the grain boundary and enhances the critical current density.

According to this invention, the manufacture of a bismuth system superconducting polycrystalline wire rod having all the crystal axes (a axis, b axis, and c axis) aligned is realized by heat-treating superconducting whiskers which have been arrayed in such a manner as to parallellize the fiber axes thereof. This method in effect establishes a technique for improving the superconducting wire rod in critical current density and enables manufacture of a superconducting wire rod having a high critical current density. It is expected that the Bi type superconducting wire rod obtained by this invention will contribute to enhancement of the properties of magnet materials for generating magnetic fields and a wire material for the storage of electric power and the transmission of electric power.

This invention will now be described more specifically below with reference to working examples and comparative examples.

EXAMPLE 1

Bi system 2212 superconducting whiskers were thoroughly stirred in hexane and then allowed to settle in a glass tube having a diameter of 1.5 mm, considerably smaller than the length of the whiskers. Application of an ultrasonic wave enabled the whiskers to be packed to a high density. At this stage, the fiber axes or the a axes of the whiskers were aligned.

Then, the suspension was treated in a drying device to expel the hexane by evaporation. The resultant aggregate of whiskers (preform) was nipped between two silver sheets, 50 $\mu$m in thickness, and pressed under a pressure of 100 MPa. At this stage, all the crystal axes of the whiskers were aligned. The shaped articles thus obtained was placed in an electric furnace and fired in air. The firing was continued at a temperature of 840° C. for a period of 120 hours. When the sample was tested for critical current density (Jc) by the current passage method, the result was 21800 A/cm$^2$ (under zero magnetic field at 4.2K, the temperature of liquid helium).

Then, this wire material was tested to determine the relation between temperature (K) and Jc ($10^4$ A/cm$^2$). The results are indicated by the open circles in FIG. 2.

COMPARATIVE EXAMPLE 1

A sample having only the c axes aligned was prepared as follows. Bi type 2212 superconducting whiskers were thoroughly stirred in hexane and then allowed to settle in a metal die having a diameter of 30 mm, considerably larger than the length of the whiskers. The suspension was dried by expelling the hexane through evaporation and the resultant aggregate of whiskers was nipped between two silver sheets, 50 $\mu$m in thickness, and pressed under a pressure of 100 MPa. The shaped article consequently obtained was cut into ribbons, which were heat-treated under the same conditions as mentioned above. The wire materials thus obtained had the fiber axes of their crystal grains oriented in random directions. When the sample was tested for Jc by the current passage method, the result was 10800 A/cm$^2$ (under zero magnetic field at 4.2K, the temperature of liquid helium).

Then, this wire material was tested to determine the relation between temperature (K) and Jc ($10^4$ A/cm$^2$). The results are indicated by the triangles in FIG. 2.

Figure 2:
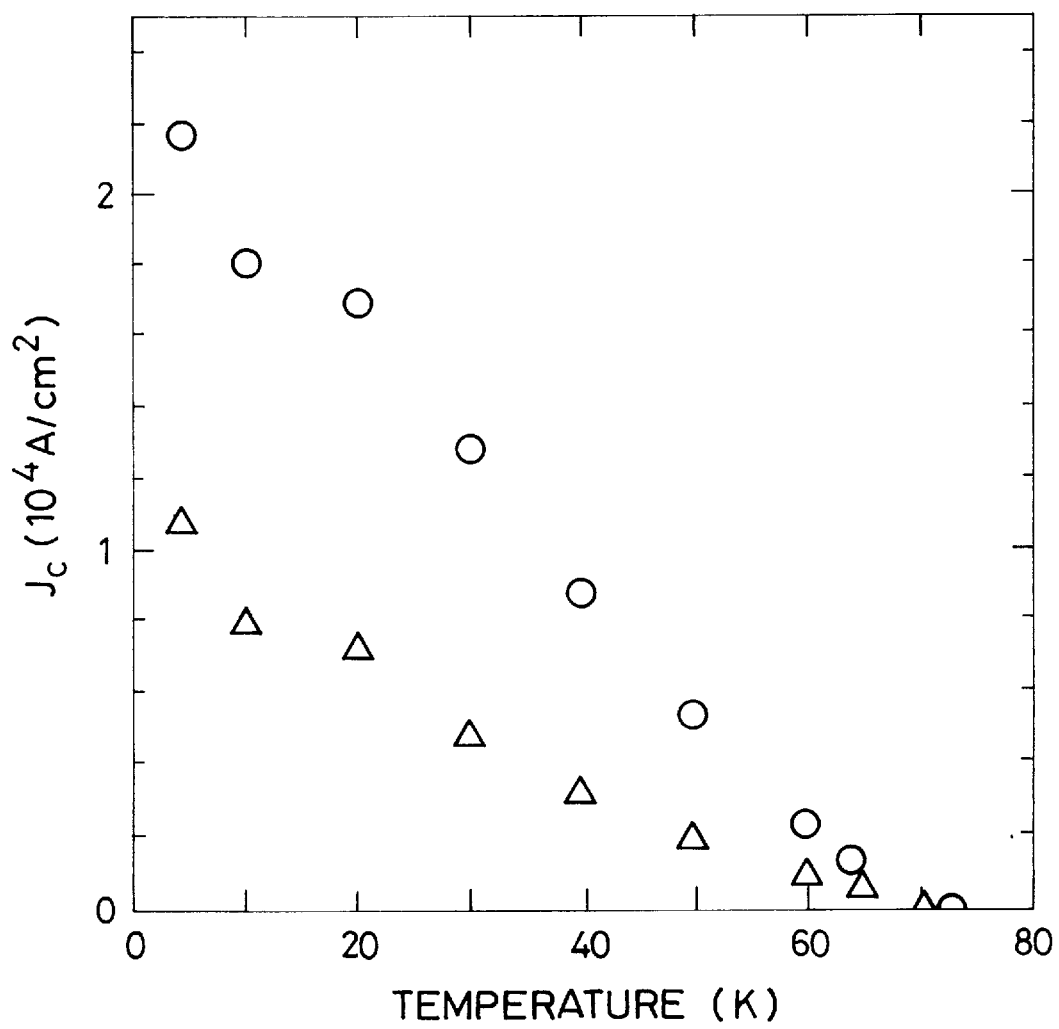
FIG. 2 is a graph showing the relation between the critical current density and the temperature, namely the temperature dependency of the critical current density, obtained of a wire rod produced by the method of this invention and having all the crystal axes of crystal grains aligned and a wire rod having the fiber axes of crystal grains in random directions.

It is clear from FIG. 2 that the wire material produced in accordance with this invention and having all the crystal axes aligned showed a higher value of Jc at all tested temperatures than the wire material having only the c axes aligned. While the wire material of the comparative example which had only the c axes aligned had a Jc of 10800 A/cm$^2$, the wire material of this invention which had all the crystal axes aligned had a Jc of 21800 A/cm$^2$, a magnitude about twice as high. X-ray diffraction analysis showed both the samples to have a single phase and contain no detectable impurity phase. The data indicate that the critical current density of a superconducting wire material was improved by aligning all the crystal axes of the crystal grains forming the wire material.

EXAMPLE 2

A shaped article having all the crystal axes aligned was prepared by following the procedure of Example 1. This shaped article was placed in an electric furnace and fired in air. The Jc of the sample tested by the current passage method was (a) 19500 A/cm$^2$ under the firing conditions of 830° C. and 140 hours, (b) 23000 A/cm$^2$ under the firing conditions of 850° C. and 80 hours, and (c) 24200 A/cm$^2$ under the conditions of 860° C. and 40 hours (under zero magnetic field at 4.2K, the temperature of liquid helium).

COMPARATIVE EXAMPLE 2

The Jc of a sample prepared by following the procedure of Example 1 but having only the c axes aligned was (a) 9500 A/cm$^2$ under the firing conditions of 830° C. and 140 hours, (b) 12000 A/cm$^2$ under the firing conditions of 850° C. and 80 hours, and (c) 11200 A/cm$^2$ under the conditions of 860° C. and 40 hours (under zero magnetic field at 4.2K, the temperature of liquid helium).

EXAMPLE 3

Bi system 2212 superconducting whiskers were thoroughly stirred in hexane and then allowed to settle in a silver tube having a diameter of 1.5 mm, considerably smaller than the length of the whiskers. Application of an ultrasonic wave enabled the whiskers to be packed to a high density. At this stage, the fiber axes or the a axes of the whiskers were aligned. Then, the suspension was treated in a drying device to expel the hexane by evaporation. The silver tube now filled with the whiskers was pressed under a pressure of 100 MPa. At this stage, all the crystal axes of the whiskers were aligned. The resultant shaped article was placed in an electric furnace and fired in air. The Jc of the sample tested by the current passage method was (a) 28000 A/cm$^2$ under the firing conditions of 830° C., and 140 hours, (b) 32600 A/cm$^2$ under the firing conditions of 840° C. and 120 hours, (c) 29000 A/cm$^2$ under the firing conditions of 850° C. and 80 hours, and (d) 35000 A/cm$^2$ under the firing conditions of 860° C. and 40 hours (under zero magnetic field at 4.2K, the temperature of liquid helium).

What is claimed is:

1. A method for the production of a superconducting polycrystalline wire rod having all the crystal (a, b, c) axes thereof aligned, consisting essentially of:

suspending a plurality of superconducting whiskers of a composition of $Bi_2Sr_2CaCU_2Cu_2O_8$ (Bi-2212 phase) in an organic solvent, placing said organic solvent suspending said whiskers therein in a container which is a glass tube or a silver tube of a diameter smaller than the length of said whiskers, removing said organic solvent therefrom and consequently obtaining a preform consisting of said superconducting whiskers whose fiber axes are oriented in one direction, press forming said preform, and heat-treating the resultant preform.

2. A method according to claim 1, wherein said Bi-2212 phase whiskers have a structure resulting from the superimposition of plural ribbonlike single crystals measuring approximately 3–20 µm in thickness, 30–300 µm in width, and 3–8 mm in length.

3. A method according to claim 1, wherein said forming of the preform is carried out under a pressure in the approximate range of 50–100 MPa.

4. A method according to claim 1, wherein said heat treatment is carried out at a temperature in the approximate range of 830°–860° C. for a period in the approximate range of 40–140 hours.

* * * * *

UNITED STATES PATENT AND TRADEMARK OFFICE
CERTIFICATE OF CORRECTION

PATENT NO. : 5,827,798
DATED : October 27, 1998
INVENTOR(S) : Ichiro MATSUBARA et al.

It is certified that error appears in the above-identified patent and that said Letters Patent is hereby corrected as shown below:

On the title page, item [73], the Assignee information should be:

--Agency of Industrial Science and Technology, Ministry of International Trade & Industry, Tokyo, Japan--

Signed and Sealed this

Sixth Day of July, 1999

*Attest:*

Q. TODD DICKINSON

*Attesting Officer*   Acting Commissioner of Patents and Trademarks